United States Patent
Ma

(10) Patent No.: US 6,673,636 B2
(45) Date of Patent: Jan. 6, 2004

(54) METHOD OF REAL-TIME PLASMA CHARGING VOLTAGE MEASUREMENT ON POWERED ELECTRODE WITH ELECTROSTATIC CHUCK IN PLASMA PROCESS CHAMBERS

(75) Inventor: Shawming Ma, Sunnyvale, CA (US)

(73) Assignee: Applied Materails Inc., Santa Clara, CA (US)

( * ) Notice: Subject to any disclaimer, the term of this patent is extended or adjusted under 35 U.S.C. 154(b) by 266 days.

(21) Appl. No.: 09/861,033

(22) Filed: May 18, 2001

(65) Prior Publication Data

US 2002/0173059 A1 Nov. 21, 2002

(51) Int. Cl.[7] ............................................. G01R 31/26
(52) U.S. Cl. .......................... 438/14; 250/397; 361/234
(58) Field of Search .......................... 438/14; 250/397; 361/234

(56) References Cited

U.S. PATENT DOCUMENTS

| | | | |
|---|---|---|---|
| 5,594,328 A | 1/1997 | Lukaszek | 324/72 |
| 5,653,811 A | 8/1997 | Chan | 118/723 I |
| 5,801,386 A * | 9/1998 | Todorov et al. | 250/397 |
| 5,904,779 A | 5/1999 | Dhindsa et al. | 118/723 E |
| 2002/0126437 A1 * | 9/2002 | Chen | 361/234 |
| 2002/0159216 A1 * | 10/2002 | Ennis | 361/234 |

FOREIGN PATENT DOCUMENTS

WO  WO 02/23583  3/2002  .......... H01J/37/304

OTHER PUBLICATIONS

Shawming Ma and James P. McVittie, "Real Time Measurement of Transients and Electrode Edge Effects in Plasma Charging Induced Damage", *International Electron Device Meeting (IEDM) Tech. Digest*, pp. 463–466, 1994.

Shigemi Murakawa and J.P. McVittie, "Direct Measurement of Surface Charging During Plasma Etching", *Jpn. J. Appl. Phys.*, vol. 33, pp. 4446–4449, 1994.

Shawming Ma and James P. McVittie, "Characterization of Plasma Surface Charging Using a Real–Time On–Wafer Probe", *Electrochem. Soc. Proc. Process Control, Diagnostics, and Modeling in Semiconductor Manufacturing I*, Proc. vol. 95–4, pp. 401–411, 1995.

(List continued on next page.)

*Primary Examiner*—William David Coleman
(74) *Attorney, Agent, or Firm*—Mayer, Fortkort & Williams; Joseph Bach

(57) ABSTRACT

An apparatus, system and method for the real-time monitoring of plasma charging during plasma processing are provided which overcome the deficiencies in currently available apparatus, systems and methods. According to one embodiment, the method and apparatus utilizes a detection wafer that comprises an Al pad located on the wafer and placed in contact with the plasma. The potential difference generated between the Al pad and a substrate as a result of plasma processing is the plasma charging voltage $V_c$. The potential difference is transmitted through electrical contacts located in a modified biased lift pin assembly supporting the detection wafer, and in the detection wafer itself, at locations remote from the plasma. Electrical contact with the detection wafer is thus established by positive physical contact from the biased lift pins and the potential difference is registered on apparatus external to the processing chamber and connected to the electrical contacts located remotely from the plasma. For example, the methodology of the present invention therefore improves on prior art devices by eliminating bonded electrical connections and wires that are traditionally located in the plasma environment and which require passage through the wall of the plasma processing chamber to connect to external monitoring and measuring equipment.

26 Claims, 5 Drawing Sheets

OTHER PUBLICATIONS

Shawming Ma and J.P. McVittie, "Characterization of Damage Reduction Effect from Dielectric Protective Layer by a Real–Time Plasma Charging Probe", *Electrochem. Soc. Proc. 11th Symp. on Plasma Processing*, Proc. vol. 96–12, p. 185–195, 1996.

Shawming Ma, Kenji Sera, and J.P. McVittie, "Use of Real–Time Plasma Charging Probe to Measure Tempral and Spatial Charging Effects on Damage and Process Uniformity", *Proc. 22nd Tegall Plasma Technology Seminar*, p. 57–61, 1996.

T. Kinosita, S. Ma, M. Hane, and J.P. McVittie, "Effects of Ion Energy Distribution on Topology Dependent Charging", *Tech. Digest 1996 Symp. on VLSI Tech.*, p. 188–189, 1996.

Shawming Ma and J.P. McVittie, "Prodiction of Plasma Charging Induced Gate Oxide Tunneling Current and Antenna Dependence by Plasma Charging Probe", *Proc. 1st International Symposium on Plasma Process–Induced Damage (P2ID)*, pp. 20–24, 1996.

Shawming Ma, J.P. McVittie and K.C. Saraswat, "Prediction of Plasma Charging Induced Gate Oxide Damage by Plasma Charging Probe", *IEEE Electron Dev. Lett.*, vol. 18(10), pp. 468–470, 1997.

Shawming Ma and James P. McVittie, "Plasma Induced Wafer Charging Sensor", *Journal of the Chiinese Institute of Engineering*, vol. 21(1), pp. 11–19, 1998.

G.A. Roche and J.P.McVittie, "Application of Plasma Charging Probe to Production HCP CVD Tool," *1st International Symposium on Plasma Process–Induced Damage*, pp. 71–74, May, 1996.

James P. McVittie and Shigemi Murakawa, "A New Probe For Digest Measurement of Surface Charging", *ECS Proc. 10th Sympoisum on Plasma Processing Proc.*, vol. 94–20, pp. 181–191, 1994.

* cited by examiner

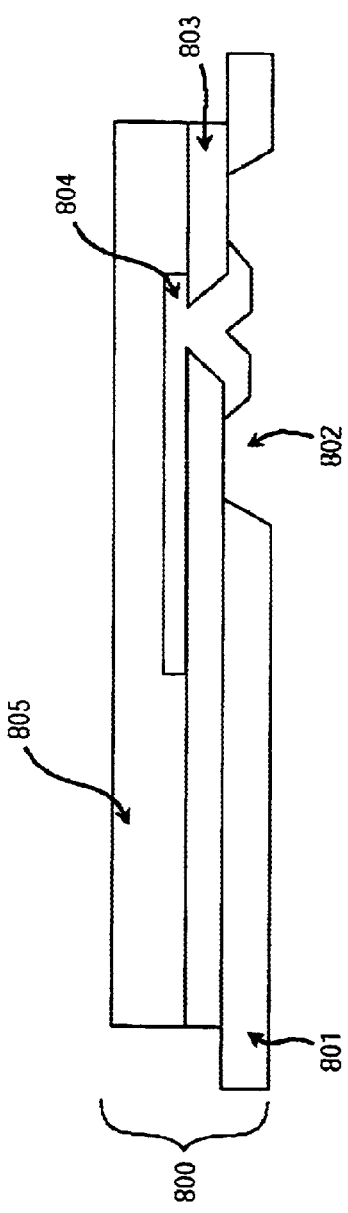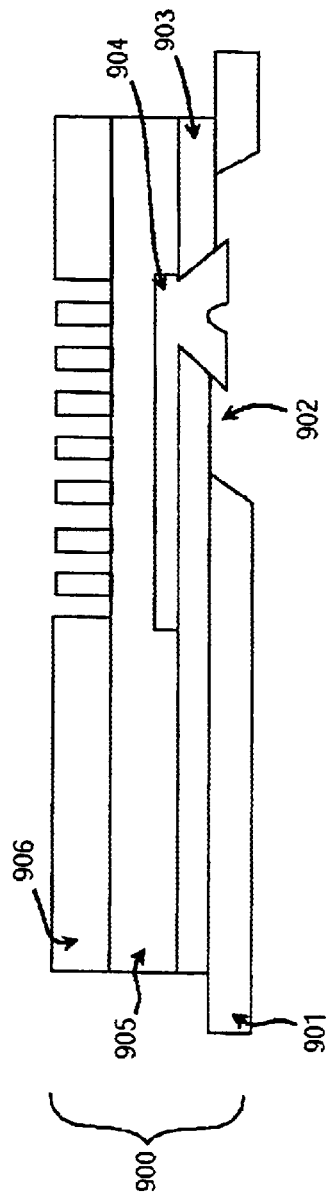

METHOD OF REAL-TIME PLASMA CHARGING VOLTAGE MEASUREMENT ON POWERED ELECTRODE WITH ELECTROSTATIC CHUCK IN PLASMA PROCESS CHAMBERS

FIELD OF THE INVENTION

This invention relates to the field of Semiconductor manufacture. More particularly, it relates to the monitoring of plasma charging during plasma processing.

BACKGROUND OF THE INVENTION

Plasma processing has become an integral part of the fabrication of integrated circuits, because it offers advantages in terms of directionality, low temperature and processing convenience. For sub-micron VLSI manufacturing, plasma etching is essential for pattern definition.
Effects of Charging During Plasma Etching However, substrate charging during plasma etching processes is a concern as it can result in both profile distortion and thin oxide damage. Etching-induced profile distortions, including tilting, bowing, undercutting and notching, may be caused by wafer surface charging. These distortions have been shown to be a serious problem particularly in sub-micron features.

As gate oxide thicknesses have decreased in an effort to improve MOS device performance, oxide damage has been experienced after various plasma processing steps, with etching and ashing being of most concern. This damage can degrade essentially all the electrical properties of a gate oxide, which include the fixed oxide charge density, the interface state density, the flat band voltage, the leakage current and the various breakdown-related parameters. In short, all the MOS transistor parameters which depend on the oxide parameters can be degraded as a result of the charging that results from plasma processing. It is, therefore, critical to monitor wafer charging during plasma processing.

The primary damage mechanism attributed to charging during plasma processing appears to be charging of the gate to a magnitude approaching the oxide breakdown voltage. When this condition occurs, conduction of sufficient Fowler-Nordheim (F-N) tunneling current is induced through the gate oxide to create enough charge traps to affect the electrical characteristics of the oxide.

In general, plasma-charging-induced device damage is characterized by the so-called "antenna dependence" relationship. In the context of charging damage, an "antenna" refers to any conductor connected to a floating gate. An antenna increases thin oxide current and thus damage by increasing the collection of unbalanced particle current from the plasma. As the charge collecting antenna area increases, so does the tunneling current due to the accumulation of additional charges.
Background on Plasma Charging Monitoring Plasma charging monitoring has taken on several forms. These, however, follow one of two broad methodologies: indirect characterization of plasma charge damage and direct monitoring.

With respect to the indirect characterization methodology, two different approaches have been used. In the first approach, the plasma damage is evaluated without extra manufacturing processes and damage is characterized by comparison to a wet-etched control device. The second approach employs already-manufactured devices which are exposed to processing plasma. Damage is evaluated by comparing the subject device properties before and after exposure to plasma. Both of these approaches are limited in effectiveness since they both involve characterization after plasma processing has taken place. In the aforementioned methods for indirect characterization of plasma charging, the surface potential is derived from the threshold measurement of EEPROM devices, circuit modeling of observed damage and from ion trajectory simulations for profile distortions. However, none of these derivations provide any way to distinguish whether the damage caused is due to transient behavior resulting from plasma on-off, or steady state charging. Measurement of plasma potential made possible by techniques such as the Langmuir probe technique are similarly deficient in the information derived since from these techniques, it is not clear that plasma potential can absolutely relate to charging voltage due to the complicated plasma sheath and the wafer surface profile contour. In this regard, electron shading in particular can cause a local charging effect.

It is therefore necessary and desirable to measure plasma charging voltage directly on the wafer surface during processing to permit etcher hardware modification and process development problem solving.

In this regard, direct methods of monitoring plasma charging in real time on a wafer surface have been developed. Generally these methods employ a sensor comprising one or more MOS capacitors manufactured on top of a wafer surface. The MOS structure is compatible with real wafer processing and the geometry of the antenna structure in an actual MOS transistor can be replicated. In this methodology, the plasma induced charging potential is measured outside the chamber during the plasma etching or deposition process.

An arrangement typical of this method is shown in FIG. 1. The sensor of FIG. 1 consists of a 4 inch Si wafer to which DC connections were made to both a large exposed Al pad on top of a 1 $\mu$m oxide and to the substrate. Contacts are made to the Al pad and substrate via on-wafer Al leads connected to flexible Cu wires at the wafer edge. All the Al leads and Cu wires are encapsulated by epoxy resin to prevent their exposure to the plasma and the possible perturbation that could result. FIG. 1 is discussed in further detail below.

In this methodology, the charging voltage, $V_c$, is defined as the DC voltage developed between the pad and the substrate. By providing real-time monitoring of the variation of charging voltage, this methodology has shown that plasma charging voltage is a function of power, pressure, gas species, magnetic field and transient time. This type of sensor has also proven to be a good diagnostic tool for equipment or process development.

The configuration of an in-situ plasma charging sensor as described above, however, has several drawbacks. For example, in these sensors, all electrical connections to the sensor and the leads connecting the sensor to monitoring equipment outside the plasma chamber are epoxy coated to prevent their exposure to the plasma. There is always a risk that the epoxy coating could be breached, thereby exposing the leads or connections to the plasma, and causing unwanted perturbation of the plasma. Perturbation of the plasma could result in inaccurate measurements of plasma charging, thereby defeating the sensor's purpose. Moreover, the layout of the sensor which necessitates the running of epoxy coated leads through the wall of the plasma chamber is inherently fragile and prone to compromise particularly where the sensor is applied to field testing of plasma etching processes and process development.

SUMMARY OF THE INVENTION

These and other drawbacks of the prior art are addressed by the present invention. According to a first embodiment of the present invention, an apparatus for the monitoring of plasma charging comprises an electrostatic chuck assembly in an etch chamber. The electrostatic chuck assembly is provided with at least two holes through which spring loaded lift pins project. The spring loaded lift pins are modified to contain electrical contacts at their ends, which project through the holes provided in the electrostatic chuck assembly.

A detection wafer is removably mounted on the electrostatic chuck assembly by electrostatic force. The detection wafer comprises a semiconductor substrate layer having a hole provided in it that aligns with one of the holes provided in the electrostatic chuck assembly. The detection wafer further comprises a dielectric layer disposed over the semiconductor substrate layer and one or more metal electrodes extending over a portion of an upper surface of the dielectric layer and extending through the dielectric layer such that the metal electrode does not contact the semiconductor layer but is accessible from a lower side of the semiconductor substrate layer via the hole in the semiconductor substrate layer. The wafer is fabricated using a series of masks with conventional processing.

When the detection wafer is placed on the electrostatic chuck and retained by electrostatic force during processing, the electrical contact in the end of one of the lift pins projecting through the holes in the electrostatic chuck is mechanically biased against the lower side of the semiconductor layer, thereby establishing electrical contact with the semiconductor layer through one hole in the electrostatic chuck assembly. The second lift pin is mechanically biased against the portion of the electrode extending through the first dielectric layer by projecting through the second hole in the electrostatic chuck assembly and the hole in the semiconductor layer accessible through the lower side of the semiconductor substrate layer respectively, thereby establishing another electrical contact. A voltage measuring apparatus is connected to the lift pins in electrical contact with the electrode and semiconductor substrate respectively and measures the differential voltage between the electrode and semiconductor substrate when the detection wafer is exposed to a plasma.

Accordingly, one advantage of the present invention is that it provides a method, system and apparatus for plasma charging voltage measurement that does not require contacts and leads to be exposed to, or routed within the plasma processing environment during the etching process.

Another advantage of the invention is that it provides a method, system and apparatus for plasma charging monitoring that does not require the use of a conducting wire between the wafer and dielectric etch chamber wall during measurement, thereby eliminating the potential of perturbation of the plasma by a conducting wire. This arrangement eliminates the potential for arcing between the wafer and the measurement wire or chamber wall that exists in typical setups.

Another advantage of the invention is that it eliminates wire bonding between a detection wafer and contacting wire.

Another advantage of the invention is that all measurement contacts are made through a modified lift pin assembly requiring no special modifications to an electrostatic chuck assembly.

Another advantage of the invention is that the detection wafer used to detect plasma charging can be reused. For example in dielectric etch, the wafer can be reused after simple resist stripping and lithography process steps thereby reducing the overall cost of the use of monitoring wafers by recycling them.

Another advantage of the invention is that the DC bias on the detection wafer, plasma density uniformity and plasma properties including ion saturation current, plasma potential and electron temperature can also be measured or calculated from the same setup.

Another advantage of the invention is that the dielectric materials used on the detection wafer can be non-Si and non-$SiO_2$ materials such as AlN, $Al_2O_3$, SiC and $Ta_2O_5$, thereby extending the wafer measurement lifetime since these materials have a longer erosion rate than Si and $SiO_2$.

Another advantage of the invention is that the environment in which monitoring of plasma charging occurs, is identical to that which is present during semiconductor manufacture, thereby providing an accurate representation of manufacturing conditions.

Yet another advantage of the invention is that it provides a method, system and apparatus for plasma charging voltage measurement and monitoring that permit easy installation and use in field applications without the risk of compromising the integrity and accuracy of the measurement apparatus for the diagnosis of problems in the field.

These and other embodiments and advantages of the present invention will become immediately apparent to those of ordinary skill in the art upon review of the remainder of the specification and the claims to follow.

BRIEF DESCRIPTION OF THE DRAWINGS

Preferred embodiments of the present invention will be described hereinbelow, by way of example only, with reference to the accompanying drawings, in which

FIG. 8 is a schematic of a detection wafer according to an embodiment of the present invention;

FIG. 9 is a schematic of a detection wafer according to an embodiment of the present invention.

DESCRIPTION OF THE PREFERRED EMBODIMENTS

The following description is merely exemplary in nature and is in no way intended to limit the invention, its application or its uses.

Figure 1:
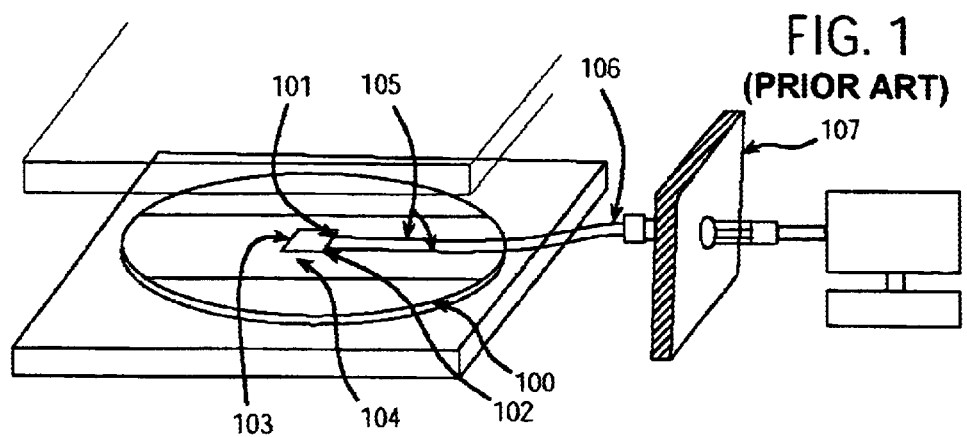
FIG. 1 is a drawing of a prior art plasma charging sensor.
Figure 2:
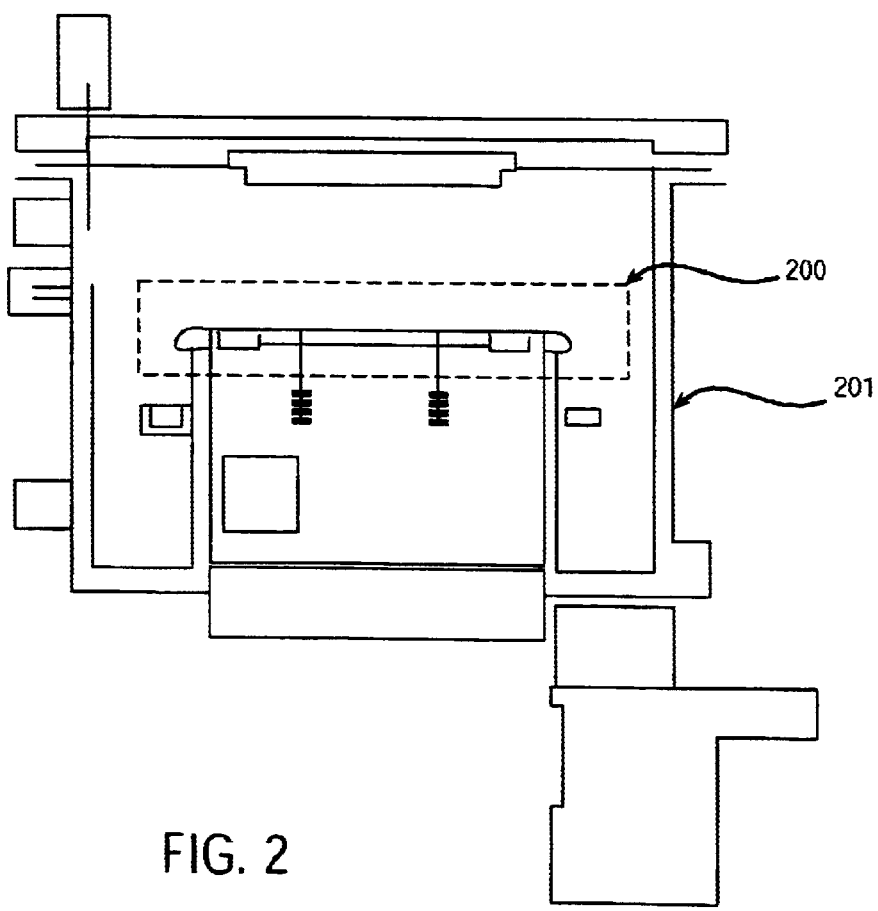
FIG. 2 is a schematic sectional view of an etch chamber.
Figure 3:
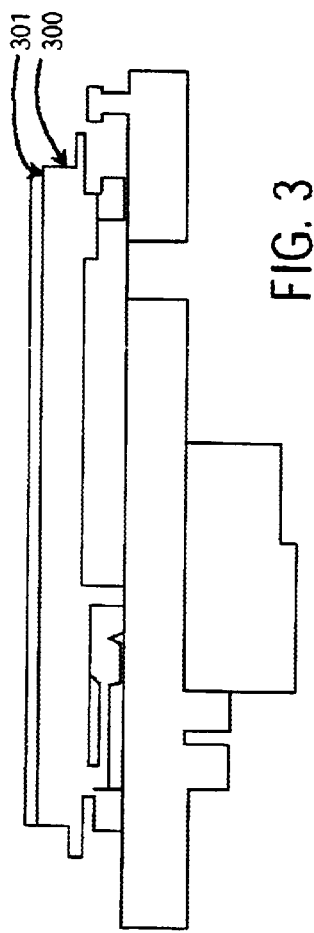
FIG. 3 is a schematic sectional view of a plasma charging detection wafer installed on an electrostatic chuck assembly in accordance with an embodiment of the present invention.

Referring now in detail to the various drawings, there is shown in FIG. 1 a plasma charging detection sensor that is a functional representative of that found in the prior art. The sensor consists of a 4 inch Si wafer 100 to which DC connections, 101 and 102, were made to a large Aluminum (Al) pad 103 and the substrate 104 respectively. Contacts are made to this Al pad 103 and substrate 104 via on-wafer Al leads 105 connected to flexible Cu wires 106 at the wafer's 100 edge. The Al leads 105 and the Cu wires 106 are completely encapsulated by epoxy resin to prevent their exposure to the plasma. The entire assembly is exposed to plasma in a vacuum chamber and the plasma charging voltage $V_c$ is defined as the DC voltage generated between the pad 103 and the substrate 104. Typically, the Cu wires 106 are routed through the chamber wall 107, whereby the plasma charging induced potential is measured outside the chamber during the plasma etching or deposition process. While effective as a method, the sensor depicted in FIG. 1 is prone to compromise in performance should a discontinuity or breach of the epoxy encapsulation of the wires 106 connected to the Al pad 103 and substrate 104, occur. Were such a discontinuity to occur, perturbation of the plasma surrounding the wires could occur, leading to inaccuracy in the measurement of plasma charging voltage being taken. The improvement of the instant invention is illustrated in the new and novel structural design embodiments of the detection wafer, measurement assembly, electrostatic chuck assembly and chamber apparatus exemplified in FIGS. 2 thru 10. With reference to FIG. 2, a sectional view of a plasma charging voltage measurement assembly 200 in accordance with an embodiment of the present invention is shown installed in a dielectric etch chamber 201. The plasma charging voltage measurement assembly is shown generally in connection with an electrostatic chuck assembly in FIG. 3 and in more detail in FIG. 4. FIG. 3 is a schematic sectional view of an electrostatic chuck assembly and FIG. 4 is a detailed schematic sectional view of a plasma charging measurement assembly in accordance with an embodiment of the present invention.

In FIG. 3, there is shown an electrostatic chuck assembly 300 with a plasma charging detection wafer 301 placed thereon.

Figure 4:
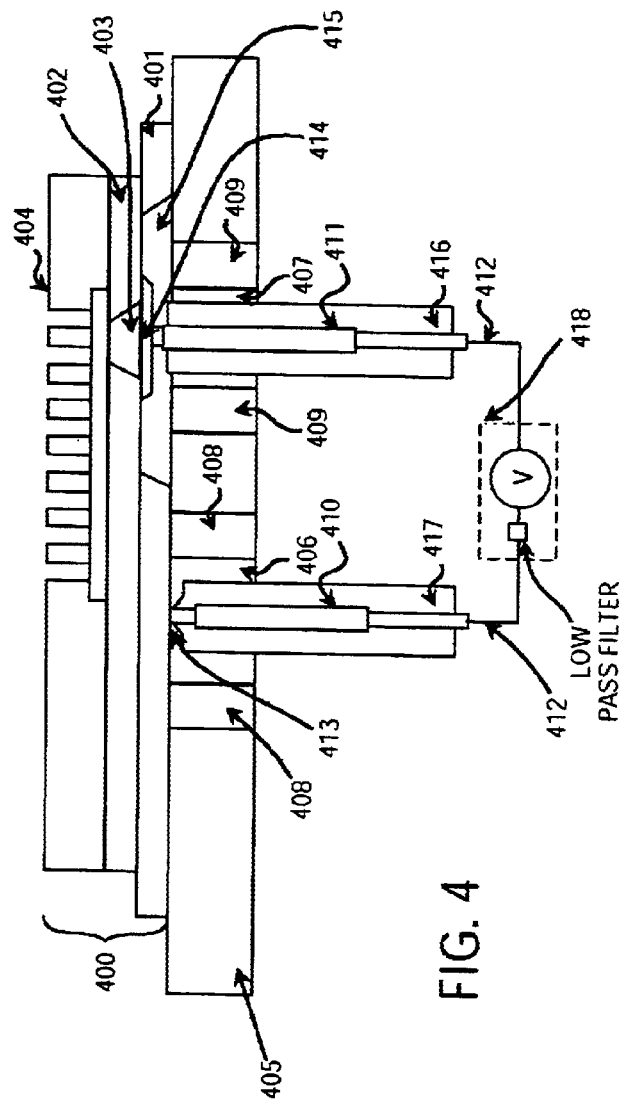
FIG. 4 is a detailed schematic sectional view of a plasma charging measurement assembly in accordance with an embodiment of the present invention.

As can best be seen from FIG. 4, the present invention comprises a plasma charging detection wafer 400 which further comprises a Si substrate 401 with a dielectric layer 402 formed on its upper surface. A metal electrode 403 is formed on the upper surface of the dielectric layer 402. The metal electrode 403 extends through the upper surface of the dielectric layer 402 to its lower surface, thereby allowing electrical contact to be made from the bottom of the detection wafer 400. In a preferred embodiment of the present invention, a patterned resist layer 404 is formed over the metal electrode 403.

The detection wafer 400 resides on an electrostatic chuck (ESC) insulator surface 405. The ESC dielectric comprises portions defining lift-pin holes 406 and 407 with isolation dielectric inserts 408 and 409 respectively. It is generally known in the art to support a wafer with a lift pin mechanism in conjunction with an electrostatic chuck. In the present invention, however, and with reference to FIG. 4, lift pins 410 and 411 are adapted to contain independent conduction wires 412 through the lift pin material, which, in a preferred embodiment, is comprised of a ceramic dielectric material, thereby forming electrical contacts 413 and 414. The lower surface of substrate 401 comprises a portion defining a hole 415 located in alignment with electrical contact 414, lift pin hole 407 and the portion of metal electrode 403 that extends through dielectric 402.

A spring-loaded mechanism 416 provides a biasing force upon lift pin 411 to create positive contact between electrical contact 414 and metal electrode 403, through lift pin hole 407 and hole 415 of the substrate 401. Similarly a spring-loaded mechanism 417 provides a biasing force upon lift pin 410, to create positive contact between electrical contact 413 and the lower surface of substrate 401 through lift pin hole 406. Differential charging voltage measurement circuitry 418, containing a low pass filter, is connected via the independent conduction wires 412, to electrical contacts 413 and 414.

As plasma processing takes place, the potential difference between contacts 413 and 414, is a measure ($V_c$) of the plasma charging resulting from the process. The configuration shown in FIG. 4 not only permits the monitoring of plasma charging in real time, but it also reduces the potential for the perturbation of the plasma and the deleterious effects resulting therefrom, by eliminating the exposure of leads and contacts to the plasma.

Moreover, by limiting all electrical contacts and connections to the lower surface of the detection wafer 400, and to the internal structure of lift pins 410 and 411 respectively, a detection wafer can be transferred from a load lock to the process chamber without breaking the process chamber's vacuum. This feature allows for ease of installing or replacing a monitoring wafer without extensive reconfiguration, and is particularly useful for field diagnostic testing and process development. Moreover, this arrangement ensures that the plasma charging monitoring environment is identical to the plasma environment present during semiconductor manufacturing, thereby providing a true assessment of manufacturing conditions.

A plasma charging detection wafer in accordance with the present invention can be manufactured using a standard test grade silicon wafer. The electrical contact on the lower surface of the substrate 401 is generally fabricated by first patterning the upper surface of the wafer and then etching a hole from the lower surface of the wafer, depositing metal within the etched hole, and finally metal patterning of the deposited metal. Alternative embodiments of the detection wafer 400 are shown in FIGS. 5–9. These wafer embodiments are adapted to different applications of plasma processing.

Figure 5:
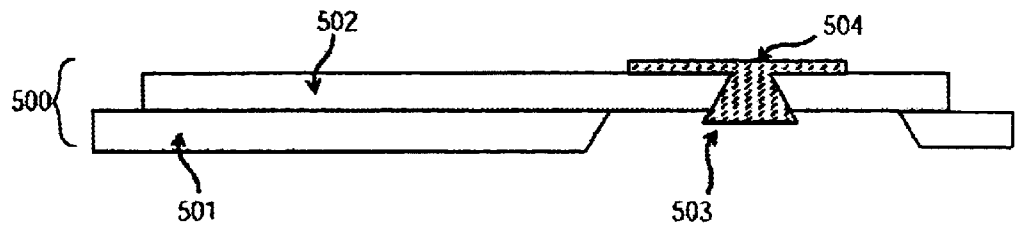
FIG. 5 is a schematic of a detection wafer according to an embodiment of the present invention.

In a second embodiment of the present invention and as shown in FIGS. 5 and 4, a detection wafer 500 comprises an Si substrate 501, a portion of which defines a hole 503. Substrate 501 is overlain by a dielectric layer 502. A metal electrode 504 is formed on the surface of dielectric layer 502 and extends through dielectric layer 502, in alignment with hole 503. This wafer configuration is particularly well suited for the monitoring of plasma charging in applications involving PECVD and HDCVD deposition techniques and resist ashing applications. In operation, the detection wafer 500 shown in FIG. 5 would replace the detection wafer 400 in FIG. 4, and combine with the other elements of FIG. 4 to form a plasma charging measurement device in accordance with an embodiment of the present invention.

Figure 6:
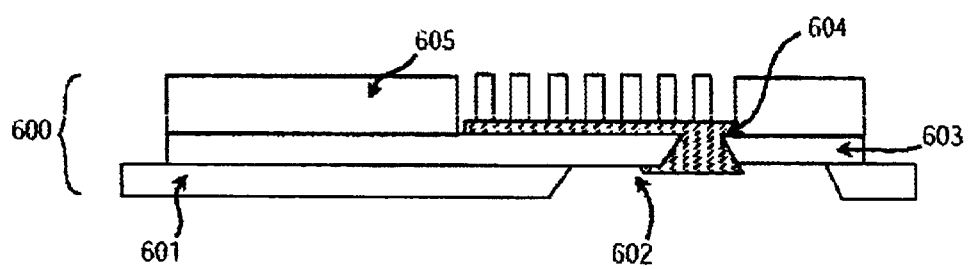
FIG. 6 is a schematic of a detection wafer according to an embodiment of the present invention.

In a third embodiment of the present invention and as shown in FIGS. 6 and 4, a detection wafer 600, comprises an Si substrate 601, a portion of which defines a hole 602. Substrate 601 is overlain by a dielectric layer 603. A metal electrode 604 is formed on the surface of dielectric layer 603 and extends through dielectric layer 603, in alignment with hole 602. A patterned resist layer 605 is formed on top of dielectric layer 603 and the upper portion of metal electrode 604. The patterning layer 605 may be of a photo resist a hard mask, an Anti-Reflective Coating (ARC) or any combination in a manner well known in the art. This particular wafer configuration is optimized for dielectric etch and PVD metal deposition processes. In operation, the detection wafer 600 shown in FIG. 6 would replace the detection wafer 400 in FIG. 4, and combine with the other elements shown in FIG. 4 to form a plasma charging measurement device in accordance with the present invention.

Figure 7:
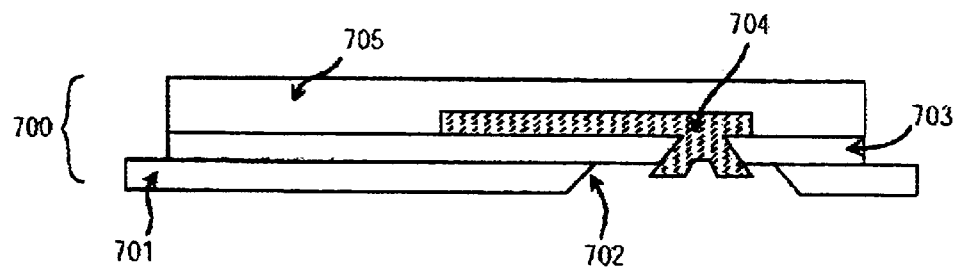
FIG. 7 is a schematic of a detection wafer according to an embodiment of the present invention.

In a fourth embodiment of the present invention and as shown in FIGS. 7 and 4, a detection wafer 700, comprises an Si substrate 701, a portion of which defines a hole 702. Substrate 701 is overlain by a dielectric layer 703. A metal electrode 704 is formed on the surface of dielectric layer 703 and extends through dielectric layer 703, in alignment with hole 702. A blanket dielectric layer 705 is formed on top of dielectric layer 703 and the upper portion of metal electrode 704. This wafer configuration is optimized for dielectric etch, conductor etch, PECVD and HDCVD deposition. In operation, the detection wafer 700 shown in FIG. 7 would replace the detection wafer 400 in FIG. 4, and combine with the other elements shown in FIG. 4 to form a plasma charging measurement device in accordance with the present invention.

In a fifth embodiment of the present invention and as shown in FIGS. 8 and 4, a detection wafer 800, comprises a Si substrate 801, a portion of which defines a hole 802. Substrate 801 is overlain by a dielectric layer 803. A metal electrode 804 is formed on the surface of dielectric layer 803 and extends through dielectric layer 803, in alignment with hole 802. A blanket resist layer 805 is formed on top of dielectric layer 803 and the upper portion of metal electrode 804. This arrangement differs from that of FIG. 7 in that a blanket resist layer 805 is formed, rather than a blanket dielectric layer 705. Alternatively, a blanket hard mask layer can be formed. This particular wafer configuration is optimized for dielectric etch and resist ashing processes. In operation, the detection wafer 800 shown in FIG. 8 would replace the detection wafer 400 in FIG. 4, and combine with the other elements shown in FIG. 4 to form a plasma charging measurement device in accordance with the present invention.

In a sixth embodiment of the present invention and as shown in FIGS. 9 and 4, a detection wafer 900, comprises an Si substrate 901, a portion of which defines a hole 902. Substrate 901 is overlain by a dielectric layer 903. A metal electrode 904 is formed on the surface of dielectric layer 903 and extends through dielectric layer 903, in alignment with hole 902. A second dielectric layer 905 is formed on top of dielectric layer 903 and the upper portion of metal electrode 904. The second dielectric layer 905 is overlain by a patterned resist layer 906. This particular wafer configuration is optimized for dielectric etch processes. In operation, the detection wafer 900 shown in FIG. 9 would replace the detection wafer 400 in FIG. 4, and combine with the other elements shown in FIG. 4 to form a plasma charging measurement device in accordance with the present invention.

Figure 10:
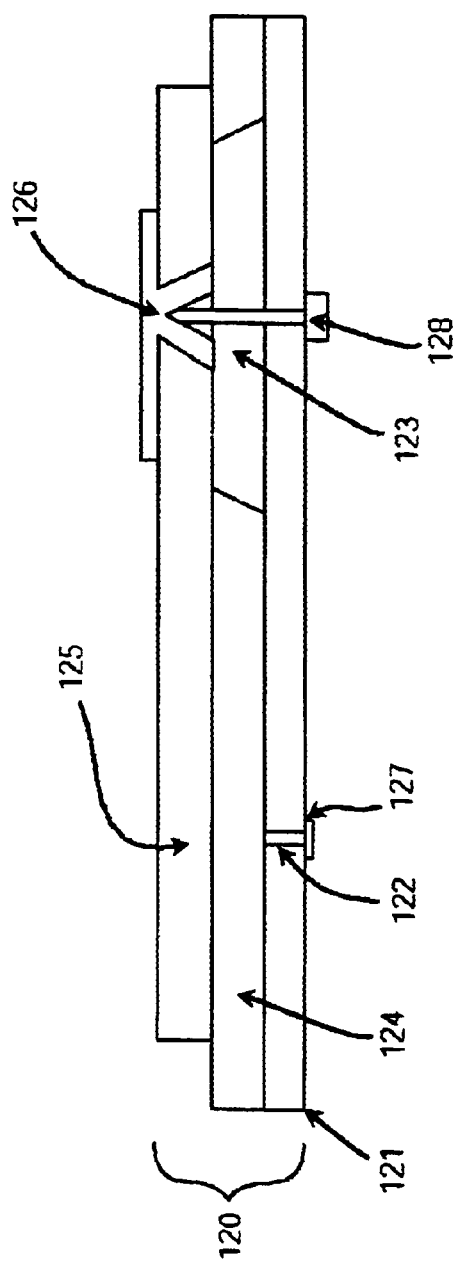
FIG. 10 is a schematic of a detection wafer according to an embodiment of the present invention.

In a seventh embodiment of the present invention and as shown in FIGS. 10 and 4, a detection wafer 120 comprises an insulator layer 121, a portion of which defines holes 122 and 123. Insulator layer 121 is overlain by an Si substrate 124, to resemble a Silicon On Insulator (SOI) structure, a portion of which defines a continuation of hole 123. Substrate 124 is overlain by a thick dielectric layer 125. A metal electrode 126 is formed on the surface of dielectric layer 125 and extends through dielectric layer 125, in alignment with hole 123. An electrical contact pad 127 is disposed within hole 122 with sufficient linear projection to make physical contact with Si substrate 124. A second contact pad 128 is disposed within hole 123, with sufficient linear projection to make physical contact with metal electrode 126. This wafer configuration permits the use of standard lift pins without the need for spring loading. In this configuration, positive mechanical contact is achieved without biasing when the wafer is mounted on the electrostatic chuck assembly.

While this wafer configuration is particularly well suited for the monitoring of plasma charging in applications involving PECVD and HDCVD deposition techniques and resist ashing applications, the use of an insulator layer with contact pins disposed through it is adaptable to the other wafer configurations outlined in the various embodiments outlined above.

In operation, the detection wafer 120 shown in FIG. 10 would replace the detection wafer 400 in FIG. 4, and combine with the other elements of FIG. 4 to form a plasma charging measurement device in accordance with the present invention.

The reader's attention is directed to all papers and documents which are filed concurrently with this specification and which are open to public inspection in conjunction with this specification, and the contents of all such papers and documents are incorporated herein by reference.

All the features disclosed in this specification (including any accompanying claims, abstract and drawings), and/or all of the steps or any method or process so disclosed, may be combined in any combination, except combinations where at least some of the features and/or steps are mutually exclusive.

Each feature disclosed in this specification (including any accompanying claims, abstract, and drawings), may be replaced by alternative features serving the same equivalent or similar purpose, unless expressly stated otherwise. Thus, unless expressly stated otherwise, each feature disclosed is one example only of a generic series of equivalent or similar features.

What is claimed is:

1. An apparatus for the monitoring of plasma charging comprising:
    an electrostatic chuck assembly;
    first and second lift pins disposed within apertures in said electrostatic chuck assembly;
    a first electrical conductor having first and second ends disposed within and extending through said first lift pin;
    a second electrical conductor having first and second ends disposed within and extending through said second lift pin; and
    a voltage measuring apparatus having at least first and second terminals, said first terminal being in electrical contact with said second end of said first electrical conductor and said second terminal being in electrical contact with said second end of said second electrical conductor.

2. A system for the monitoring of plasma charging comprising:
    an etch chamber, said etch chamber comprising
        wafer within said chamber, said wafer comprising a semiconductor substrate, a dielectric layer and a metal electrode, wherein said metal electrode is separated from said semiconductor substrate by said dielectric layer; and
        a monitoring module in electrical connection with said wafer via at least first and second electrical conductors which contact said wafer from a lower side of said semiconductor substrate remote from said plasma, said monitoring module measuring at least a potential difference between said semiconductor substrate and said metal electrode when said wafer is in the presence of a plasma, said potential difference being indicative of the amount of charging on said wafer in the presence of said plasma during plasma processing.

3. The system recited in claim 2 wherein said monitoring module comprises a voltmeter connected in series to a low pass filter.

4. A method for monitoring plasma charging during plasma processing of a wafer comprising:
   providing a wafer, said wafer comprising a semiconductor substrate, a dielectric layer and a metal electrode, wherein said metal electrode is separated from said semiconductor substrate by said dielectric layer;
   exposing said wafer to a plasma;
   measuring a potential difference between said metal electrode and said semiconductor substrate through at least first and second electrical conductors which contact said wafer from a lower side of said semiconductor substrate remote from said plasma.

5. A detection wafer for measuring a plasma charging potential comprising:
   a semiconductor substrate having a first aperture formed therein;
   a first dielectric layer over at least a portion of said semiconductor substrate and said first aperture; and
   a metal electrode extending (i) over a portion of an upper surface of said first dielectric layer and (ii) through said first dielectric layer, such that said metal electrode does not contact said semiconductor substrate and such that said metal electrode is accessible from a lower side of said semiconductor substrate via said first aperture.

6. The detection wafer of claim 5, further comprising a second dielectric layer over an upper surface of said first dielectric layer and an upper surface of said electrode.

7. The detection wafer of claim 6, wherein said second dielectric layer is patterned in the region over said electrode.

8. The detection wafer of claim 7, wherein said second dielectric layer pattern is provided with a high aspect ratio.

9. The detection wafer of claim 5, further comprising a resist layer over an upper surface of said first dielectric layer and an upper surface of said electrode.

10. The detection wafer of claim 9, wherein said resist layer is patterned in the region over said electrode.

11. The detection wafer of claim 10, wherein said resist layer pattern is provided with a high aspect ratio.

12. The detection wafer of claim 5, further comprising a second dielectric layer over an upper surface of said first dielectric layer and an upper surface of said electrode, and a resist layer over an upper surface of said second dielectric layer, said resist layer being patterned in a region over said electrode.

13. The detection wafer of claim 12, wherein said resist layer pattern is provided with a high aspect ratio.

14. The detection wafer of claim 5, wherein said semiconductor is selected from silicon and gallium arsenide.

15. The detection wafer of claim 5, wherein said first dielectric layer is selected from AlN, $Al_2O_3$, SiC and $Ta_2O_5$, $SiO_2$ and $SiN_4$.

16. A plasma charging measuring system comprising:
   a detection wafer for measuring a plasma charging potential comprising:
      a semiconductor substrate having a first aperture formed therein;
      a first dielectric layer over at least a portion of said semiconductor substrate and said first aperture; and
      a metal electrode extending (i) over a portion of an upper surface of said first dielectric layer and (ii) through said first dielectric layer, such that said metal electrode does not contact said semiconductor substrate and such that said metal electrode is accessible from a lower side of said semiconductor substrate via said first aperture;
   a voltmeter;
   a first electrical connection between said voltmeter and said semiconductor substrate; and
   a second electrical connection between said voltmeter and said metal electrode,
   wherein said voltmeter is adapted to measure a potential difference between said semiconductor substrate and said metal electrode during a plasma processing step, and
   wherein said first electrical connection is established with said semiconductor substrate and said second electrical connection is established with said electrode from a lower side of said semiconductor substrate, remote from said plasma.

17. The measuring system of claim 16, wherein said first and second electrical connections comprise spring-loaded lift pins.

18. The measuring assembly of claim 16, wherein said lift pins are disposed within dielectric sleeves within a dielectric plate of an electrostatic chuck.

19. An apparatus for the monitoring of plasma charging comprising:
   an electrostatic chuck assembly;
   first and second lift pins disposed within apertures in said electrostatic chuck assembly;
   a first electrical conductor having first and second ends, disposed within and extending through said first lift pin;
   a second electrical conductor having first and second ends, disposed within and extending through said second lift pin;
   a detection wafer removably mounted on said electrostatic chuck assembly, said detection wafer comprising: (1) a semiconductor substrate layer, said semiconductor substrate layer having a portion defining a hole, (2) a first dielectric layer disposed over at least a portion of said semiconductor substrate layer, and (3) a metal electrode extending over a portion of an upper surface of said first dielectric layer and extending through said first dielectric layer such that said metal electrode does not contact said semiconductor substrate layer and such that said metal electrode is accessible from a lower side of said semiconductor substrate layer via said portion of said semiconductor substrate layer having a hole
   wherein, upon mounting said detection wafer on said electrostatic chuck assembly, (1) said first end of said first electrical conductor within said first lift pin is biased against a lower surface of said semiconductor substrate layer and is in electrical contact with said semiconductor substrate Layer and (2) said first end of said second electrical conductor within said second lift pin is biased against a lower surface of said metal electrode and is in electrical contact with said metal electrode;
   a voltage measuring apparatus having at least first and second terminals, said first terminal being in electrical contact with said second end of said first electrical conductor and said second terminal being in electrical contact with said second end of said second electrical conductor, whereby a potential difference is measured between said semiconductor substrate and said metal electrode when said detection wafer is exposed to a plasma.

20. An apparatus for the monitoring of plasma charging as recited in claim 19 further comprising a patterned second dielectric layer disposed on said first dielectric layer.

21. An apparatus for the monitoring of plasma charging as recited in claim 19 further comprising a patterned resist layer disposed on said first dielectric layer.

22. An apparatus for the monitoring of plasma charging as recited in claim 19 further comprising a blanket second dielectric layer disposed on said first dielectric layer.

23. An apparatus for the monitoring of plasma charging as recited in claim 19 further comprising a blanket resist layer disposed on said first dielectric layer.

24. An apparatus for the monitoring of plasma charging as recited in claim 19 further comprising
    a blanket second dielectric layer disposed on said first dielectric layer; and
    a patterned resist layer disposed on said blanket second dielectric layer.

25. An apparatus for the monitoring of plasma charging as recited in claim 19 wherein (1) said first lift pin comprises a spring for biasing said first end of said first electrical conductor against said lower surface of said semiconductor substrate layer and (2) said second lift pin comprises a spring for biasing said first end of said second electrical conductor against said lower surface of said metal electrode.

26. An apparatus for the monitoring of plasma charging as recited in claim 19 wherein said voltage measuring apparatus is a voltmeter connected in series to a low pass filter.

* * * * *